(12) United States Patent
Myers et al.

(10) Patent No.: US 10,996,269 B2
(45) Date of Patent: May 4, 2021

(54) ADAPTING THE USAGE CONFIGURATION OF INTEGRATED CIRCUIT INPUT-OUTPUT PADS

(71) Applicant: ARM LIMITED, Cambridge (GB)

(72) Inventors: James Edward Myers, Bottisham (GB); Parameshwarappa Anand Kumar Savanth, Cambridge (GB)

(73) Assignee: ARM Limited, Cambridge (GB)

( * ) Notice: Subject to any disclaimer, the term of this patent is extended or adjusted under 35 U.S.C. 154(b) by 223 days.

(21) Appl. No.: 15/533,479

(22) PCT Filed: Dec. 22, 2015

(86) PCT No.: PCT/GB2015/054126
§ 371 (c)(1),
(2) Date: Jun. 6, 2017

(87) PCT Pub. No.: WO2016/113530
PCT Pub. Date: Jul. 21, 2016

(65) Prior Publication Data
US 2018/0164375 A1    Jun. 14, 2018

(30) Foreign Application Priority Data
Jan. 12, 2015   (GB) ..................... 1500414

(51) Int. Cl.
*G01R 31/28*     (2006.01)
*G01R 31/317*    (2006.01)
*G06F 11/27*     (2006.01)

(52) U.S. Cl.
CPC .  *G01R 31/31715* (2013.01); *G01R 31/31721* (2013.01); *G01R 31/31724* (2013.01); *G06F 11/27* (2013.01)

(58) Field of Classification Search
CPC .......... G01R 31/31715; G01R 31/3721; G01R 31/31724; G06F 11/27
(Continued)

(56) References Cited

U.S. PATENT DOCUMENTS

| 6,163,867 A | 12/2000 | Miller et al. |
| 6,539,511 B1 | 3/2003 | Hashizume |

(Continued)

FOREIGN PATENT DOCUMENTS

WO    WO 2005/004238       1/2005

OTHER PUBLICATIONS

Jerry M. Rosenberg, "Dictionary of Computers, Information Processing & Telecommunications", 2nd edition, by John Wiley & Sons, Inc. , 1987, pp. 94, 327 and 354. (Year: 1987).*
International Search Report for PCT/GB2015/054126, dated Jun. 1, 2016, 3 pages.
Written Opinion of the ISA for PCT/GB2015/054126, dated Jun. 1, 2016, 6 pages.

(Continued)

*Primary Examiner* — Christine T. Tu
(74) *Attorney, Agent, or Firm* — Nixon & Vanderhye P.C.

(57) ABSTRACT

Techniques for implementing a self-test procedure of an integrated circuit are provided, where the self-test procedure comprises testing for an electrical connection between first and second input-output pads of the integrated circuit. A control device is capable of adapting a functional configuration of usage of the first and second input-output pads in dependence on presence of the electrical connection. A corresponding integrated circuit, printed circuit and method are also provided. These techniques allow the integrated circuit to be used in a variety of contexts, without requiring physical customisation of the integrated circuit to adapt it to its usage context, in particular where connections from the context to the pads of the integrated circuit may be made to individual pads in some contexts or may span more than one pad in other contexts.

21 Claims, 7 Drawing Sheets

(58) Field of Classification Search
USPC .................. 714/733, 734, 724, 725, 742
See application file for complete search history.

(56) References Cited

U.S. PATENT DOCUMENTS

| | | | |
|---|---|---|---|
| 6,885,212 B2* | 4/2005 | Yamamoto | G01R 31/04 324/754.03 |
| 8,826,087 B2* | 9/2014 | Tekumalla | G01R 31/318572 714/718 |
| 9,357,649 B2* | 5/2016 | Chun | H05K 1/117 |
| 2010/0244848 A1 | 9/2010 | Barrenscheen et al. | |
| 2014/0143621 A1* | 5/2014 | Tekumalla | G01R 31/318555 714/727 |

OTHER PUBLICATIONS

Search Report for GB1500414.6, dated Jun. 23, 2015, 3 pages.
Dr. Metin Koyuncu, "Interconnection Technologies for Flexible Systems" *INTERFLEX Final Project Report*, Jan. 1, 2010, pp. 1-39.
Marcel Tichem et al., "Towards Reel-to-Reel Integration of Ultra-Thin Chips to Polymer Foils" *Chip2Foil*, http://www.chip2foil.en/, Sep. 17, 2012, 6 pages.
First Office Action for CN Application No. 201580072505.1 dated Mar. 16, 2020 and English translation, 18 pages.
Second Office Action for CN Application No. 201580072505.1 dated Dec. 4, 2020 and English translation, 18 pages.
Examination Report for GB Application No. 1500414.6 dated Feb. 26, 2021, 4 pages.

* cited by examiner

TIME CHARACTERISTIC => TRACE CAPACITANCE

ADAPTING THE USAGE CONFIGURATION OF INTEGRATED CIRCUIT INPUT-OUTPUT PADS

This application is the U.S. national phase of International Application No. PCT/GB2015/054126 filed 22 Dec. 2015, which designated the U.S. and claims priority to GB Patent Application No. 1500414.6 filed 12 Jan. 2015, the entire contents of each of which are hereby incorporated by reference.

TECHNICAL FIELD

The present techniques relate to the usage configuration of input-output pads of an integrated circuit.

BACKGROUND

It is known that the usage configuration for input-output pads of an integrated circuit may not be definitively prescribed by the designer of the integrated circuit, but rather this configuration may be left to the end user in dependence on software which runs on the integrated circuit when in use. For example, it is known for bi-directional digital input-output drivers to be provided in association with each pad, where these are held in a tri-stated enable configuration after power-on-reset (or have inputs with weak internal pull-ups) until user-defined software configures them for the specific usage configuration required (e.g. a particular printed circuit board (PCB) or application context).

SUMMARY

Viewed from a first aspect there is provided a control device for on-chip implementation capable of implementing a self-test procedure, wherein the self-test procedure comprises testing for electrical connection between first and second input-output pads to which the control device is connected, and the control device is capable of adapting a functional configuration of usage of the first and second input-output pads in dependence on presence of the electrical connection.

Viewed from a second aspect there is provided an integrated circuit comprising a control device according to the first aspect.

Viewed from a third aspect there is provided circuitry comprising printed circuit components connected to the integrated circuit of the second aspect.

Viewed from a fourth aspect there is provided a method of self-testing in a control device comprising:
testing for electrical connection between first and second input-output pads to which the control device is connected;
and adapting a functional configuration of usage of the first and second input-output pads in dependence on presence of the electrical connection.

Viewed from a fifth aspect there is provided a control device comprising: means for testing for electrical connection between first and second input-output pads to which the control device is connected; and means for adapting a functional configuration of usage of the first and second input-output pads in dependence on presence of the electrical connection.

BRIEF DESCRIPTION OF THE DRAWINGS

The present techniques will be described further, by way of example only, with reference to embodiments thereof as illustrated in the accompanying drawings, in which.

DESCRIPTION OF EMBODIMENTS

Figure 1A:
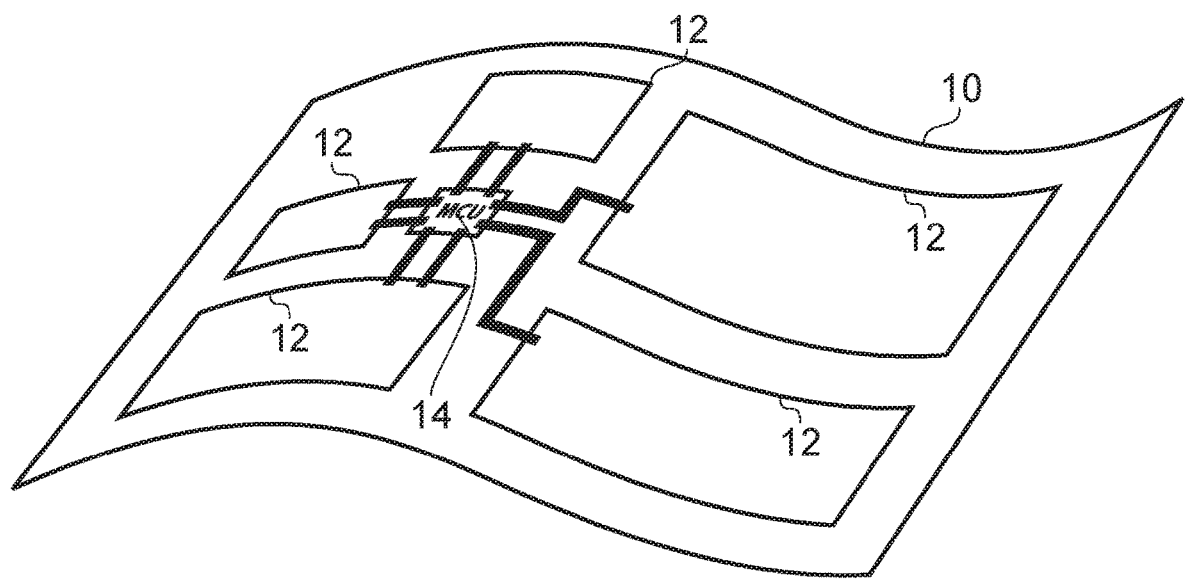
FIG. 1A shows a flexible printed circuit in one embodiment in which a silicon-implemented microcontroller is connected to various printed circuit components by printed connections.

The present techniques are in particular based on the realisation that the usage configuration of the input-output pads of a chip can be arranged not only to depend on particular configuration choices with respect to the internal operation of the components on-chip, but may also depend on the physical context in which the chip is used. More particularly, it has been recognised by the inventors that the scale of the connections made to the input-output pads of the chip can depend on the physical context in which the chip is used. Whilst the chip may be used in a context in which individual connections to each of the input-output pads of the chip may be feasible, the chip may also be used in a context in which the scale of the connections available may be such that such individual connections are not possible and, for example, it may only be possible to provide connections which contact more than one input-output pad of the chip (for example a pair of input-output pads). One example context in which this may be the case is where the integrated circuit is mounted onto a printed circuit, where the printed circuit has a density and resolution which noticeably differs (i.e. is of lower density and poorer resolution) to that of the chip itself. The printed circuit here may for example be a polymer foil onto which circuit components have been added by screen printing or ink-jet printing. Whilst such printing techniques allow circuitry to be formed on thin, flexible substrates (such as polymer foils), the resolutions achievable are typically much lower than those possible in an silicon-implemented integrated circuit. As a result it may not be possible for individual connections from the printed circuit to the pads of the chip to be provided by the printing technology which generates the printed circuit, and if such individual connections are necessary then these may only then be provided by the use of an additional manufacturing process using a different technology, which can add considerably to the cost involved. Using the printing technology which generates the printed circuit to provide the connections may mean that instead of individual pad connections it is instead only possible to provide (at best) a joint connection to two input-output pads of the chip. As a result, the context in which the chip is to be used may have a significant influence on the necessary configuration of the chip with respect to its usage of its input-output pads, and redesigning the layout of the chip to match can significantly increase the associated design and production costs, even if the majority of the chip could remain the same (since provision of even a single extra mask used for one layer of the design can be very expensive).

In this light, the inventors of the present invention have realised that it would be advantageous for a generic chip to be provided which could be used in a range of contexts, in particular in contexts which differ in their ability to allow individual or combined connections to the input-output pads of the chip to be made. Accordingly, the present techniques provide a control device which can form part of the components provided on-chip, which is capable of (i.e. has a configuration which enables it to) perform a self-test procedure, which is applied to a pair of input-output pads of the chip, and enables a determination to be made of whether those two input-output pads have individual connections or a joint connection. This is done by determining whether an electrical connection (a "short") is present between the pair of input-output pads. Having made this determination the control device is then able to adapt the functional configuration with respect to how the pair of input-output pads are used during further (i.e. normal) operation of the chip, in dependence on whether this electrical connection has been determined to be present or not. This self-test procedure could be carried out at any desired juncture, but may in particular be used after a power-on-reset in order to ensure that this determination is made before normal usage of the chip commences and appropriate self-configuration before that normal usage is carried out.

A chip will typically be provided with more than just two input-output pads and accordingly in one embodiment the control device is connected to a plurality of input-output pads comprising the first and second input-output pads, and the self-test procedure comprises iteratively testing each input-output pad of the plurality of input-output pads for electrical connection between that input-output pad and an adjacent input-output pad. Thus each input-output pad of the chip can be tested in turn to determine whether it is electrically connected (shorted) to an adjacent (neighbouring) input-output pad.

Having determined whether a pair of input-output pads are electrically connected, the adaptation to the functional configuration of usage of the two input-output pads may take a number of forms. For example, in some embodiments, the control device is capable of disabling usage of one of the first and second input-output pads in response to the presence of the electrical connection between the first and second input-output pads. Thus, where it is found that the two input-output pads are electrically connected to one another then it may be concluded that usage of one of the input-output pads is redundant and its usage may be disabled (for example by setting an enable signal to that input-output pad to have a permanently disabling value).

Alternatively, in some embodiments, the control device is capable of configuring parallel output usage of the first and second input-output pads in response to the presence of the electrical connection between the first and second input-output pads. Thus, where the two input-output pads are found to be electrically connected, the functional configuration of usage of the two input-output pads may be then set up to be such that the two input-output pads are used in parallel, i.e. the same signal is output to the two pads (when used in an output pad configuration). One result of this parallel usage of the two input-output pads can be that the control device is able to drive a higher current output on the combined output, which may for example be desirable when the combined connection to the two input-output pads is a higher capacitance connection which can benefit from such a higher current supply.

One way by which the control device may determine if a higher current supply to the combined connection of the two input-output pads would be useful is by determining a capacitance of the combined connection. Thus, in one embodiment the testing for electrical connection between the first and second input-output pads further comprises a capacitance determination with respect to the first and second input-output pads, and the control device is capable of selecting between more than one usage configuration of the first and second input-output pads in dependence on the capacitance determination. This capacitance determination with respect to the first and second input-output pads (i.e. to the combined connection when the first and second input-output pads are shorted) may for example be carried out by applying an output signal to one input-output pad and measuring the time response of the received signal from the other input-output pad. A determination of the relative capacitance of the combined connection can then be made from the time characteristic of the received signal relative to the applied output signal. The control device can then select between various usage configurations of the two input-output pads in dependence on this capacitance determination. For example, this could simply be a selection between signal usage of only one input-output pad (and disabling the other) and parallel usage of both input-output pads. Alternatively, it may be the case that at least one of the input-output pads has a driver which is able to provide a number of current outputs to the input-output pad, and the control device may select between these current output configurations of one or both of the input-output pads in dependence on the relative capacitance determination made.

Whilst one or both of the pair of input-output pads may only be provided with a uni-directional driver, in one embodiment the first and second input-output pads are bi-directional input-output pads, and the self-test procedure comprises testing each of the first and second input-output pads in an input pad configuration and in an output pad configuration. For example, one input-output pad may be put into a input pad configuration whilst the other is put into an output pad configuration for a first part of the self-test procedure and then the opposite configuration may then be used for a second part of the self-test procedure. Indeed, a fully exhaustive self-test procedure may comprise all permutations of putting each input-output pad into an input pad configuration, an output pad configuration and a tri-stated (disabled) configuration in turn.

Whilst the testing for the electrical connection between the two input-output pads could be implemented in a number of ways, in one embodiment testing for electrical connection between the first and second input-output pads comprises applying a test sequence of electrical states to one of the first and second input-output pads in an output pad configuration and measuring a resulting sequence of electrical states of the other of the first and second input-output pads in an input pad configuration. Thus, instead of merely applying a static value to one or both of the input-output pads, a test sequence of electrical states can be used, which therefore involves switching of the values applied to the two input-output pads and can therefore test for the situation that at least one of the input-output pads is shorted to a particular value (for example by being shorted to VDD or VSS). If one of the pads were shorted to a particular value like this it could appear to provide an appropriate response to the same test value being applied to it, but would not behave appropriately when subsequent switching occurred and this can therefore be detected.

The result of the self-test procedure may be used in a number of ways, but in one embodiment the control device is capable of causing a result of the self-test procedure to be stored and to cause further usage of the first and second input-output pads to depend on the stored result of the self-test procedure. For example the full results of the self-test procedure could be stored to memory for a controller (e.g. a CPU) to later reference and make use of, or the determined usage configuration resulting from the self-test procedure could be stored, for example in dedicated storage components which control the usage of the input-output pads such as flip-flops holding values which set the input or output configuration of a bi-directional input-output pad for further functional usage.

The control device may take a number of forms and could for example be a state machine, which is used on-chip after a power-on-reset in order to self-configure the chip. Thus the self-test procedure of the present techniques may be added to the set of states which the state machine implements in order to configure the chip after power-on-reset. The control device could also be a CPU (e.g. providing or forming part of a microcontroller) which is thus configured to be able to administer this self-test procedure itself.

Where an integrated circuit is provided, for example, in the form of a silicon-implemented chip, the chip may comprise a control device according to any individual embodiment described above, or combination of those embodiments.

It may be the case that, regardless of the context in which the integrated circuit is implemented, there are one or more particular input-output pads of the integrated circuit for which the connection from the context outside the integrated circuit should be particularly reliable and accordingly in one embodiment the integrated circuit comprises a plurality of input-output pads, wherein the plurality of input-output pads comprises a protected input-output pad which has a dedicated input function for the integrated circuit, and wherein a neighbouring input-output pad to the protected input-output pad has a configuration for disabling the neighbouring input-output pad when the electrical connection is present. By providing a neighbouring input-output pad to the protected input-output pad which can be disabled when the electrical connection is present, it can be ensured that whether or not the connections provided by the context in which the integrated circuit is used only connect to the protected input-output pad itself or connect to the protected input-output pad and its neighbour, the usage of the protected input-output pad only has a single configuration, with an input function which is reliably provided. A critical input to the integrated circuit is thus protected. Moreover, the neighbouring input-output pad can be provided with connections to the integrated circuit which allow it to have a dedicated function (for example as a general purpose input-output (GPIO)) when the context allows individual connections to the pads to be made, but where this dedicated function is not critical to the operation of the integrated circuit, it can be disabled when the pad connections from the context are made which span two pads, whilst still allowing the integrated circuit to function.

This single configuration of the protected input-output pad could be provided for a range of types of input-output pad connection, but in one embodiment the protected input-output pad provides a voltage supply connection (e.g. to VDD or to VSS). In another embodiment the protected input-output pad provides a clock signal connection. These critical connections for the integrated circuit can thus be particularly reliably provided, regardless of the context in which the integrated circuit is used.

In one embodiment, the integrated circuit comprises a plurality of input-output pads, wherein a first subset of the plurality of input-output pads provides a first input-output interface and a second subset of the plurality of input-output pads provides a second input-output interface, and the first subset is interleaved with the second subset. Interleaving the first and second subset in this manner means that the individual input-output pads of the first and second subsets are paired up in such a way that if the integrated circuit is used in a context in which connections are made to pairs of input-output pads then the resulting connections provided to the first and second output interfaces are such that effectively one combined input-output interface is provided, having the same sequence of input-output pads of either subset. Thus the requirement for further modification of the connections within the integrated circuit to the input-output pads, in dependence on whether the integrated circuit is used in a context in which individual or joint connections are made to the input-output pads, is avoided.

In one embodiment the integrated circuit comprises an analogue input-output pad and digital test circuitry connected to the analogue input-output pad, wherein the digital test circuitry is capable of selecting between an input configuration and an output configuration for the analogue input-output pad during the self-test procedure, and wherein the digital test circuitry is disabled during subsequent operation of the integrated circuit. An analogue input-output pad, by its analogue nature, will typically not be able to limit the use of the pad to a particular input or output configuration, and the digital test circuitry thus enables the input-output pad to participate in the self-test procedure, in particular to test the analogue input-output pad in combination with another pad, to determine if the electrical connection is present between the two. For example, the two pads can then be tested in each direction, i.e. where the first pad is configured for output and the second pad is configured for input, and then vice versa. The digital test circuitry is only active during the test-procedure and is then disabled to allow normal analogue usage of the analogue input-output pad.

In one embodiment the integrated circuit comprises power-gating circuitry for providing a selectable power supply to an input-output pad control component, wherein the control device is capable of controlling the power gating circuitry to disconnect the selectable power supply from input-output pad control component. For example, a driver and/or a controller associated with a particular input-output pad may thus be power gated under control of the control device. Where a pair of input-output pads are found to be electrically connected, and as a result only the driver/ controller associated with one pad is configured for functional usage as a result of the self-test procedure, the driver/controller associated with the other pad can thus be power-gated off to save power consumption during functional operation of the integrated circuit.

As mentioned above, the context in which the present techniques are used may take a number of forms, and in particular where the techniques are implemented in an integrated circuit the context for which the input-output pads of that integrated circuit connect may vary, but in some embodiments there is provided circuitry comprising printed circuit components connected to the integrated circuit of any of the above-described embodiments (whether individually or in combination). Printed circuitry may be a particularly relevant context for the application of the present techniques because, at least according to contemporary manufacturing techniques, printed circuitry may only be able to be provided at a resolution which is noticeably lower than the resolution at which an integrated circuit can be provided, and this may result in connections to the input-output pads of the integrated circuit from the printed circuitry being such (if also printed) that more than one input-output pad of the integrated circuit is contacted by a connection from the printed circuitry.

In one embodiment the printed circuitry comprises a printed conductive component electrically connecting the first and second input-output pads.

In one embodiment the integrated circuit comprises a plurality of control devices of any of the above-described embodiments (whether individually or in combination), wherein the plurality of control devices are communicatively interconnected to implement a testing protocol in which only one control device of the plurality of control devices at a time carries out its self-test procedure whilst input-output pads of the other control devices are held in a non-operational state. The input-output pads which are tested by one control device may be connected, directly or indirectly, to the input-output pads of another control device, and to ensure that the self-test procedure carried out by one control device does not risk damage to components connected to the input-output pads of another control device, those latter input-output pads can be held in a non-operational state (for example tri-stated).

Figure 1B:
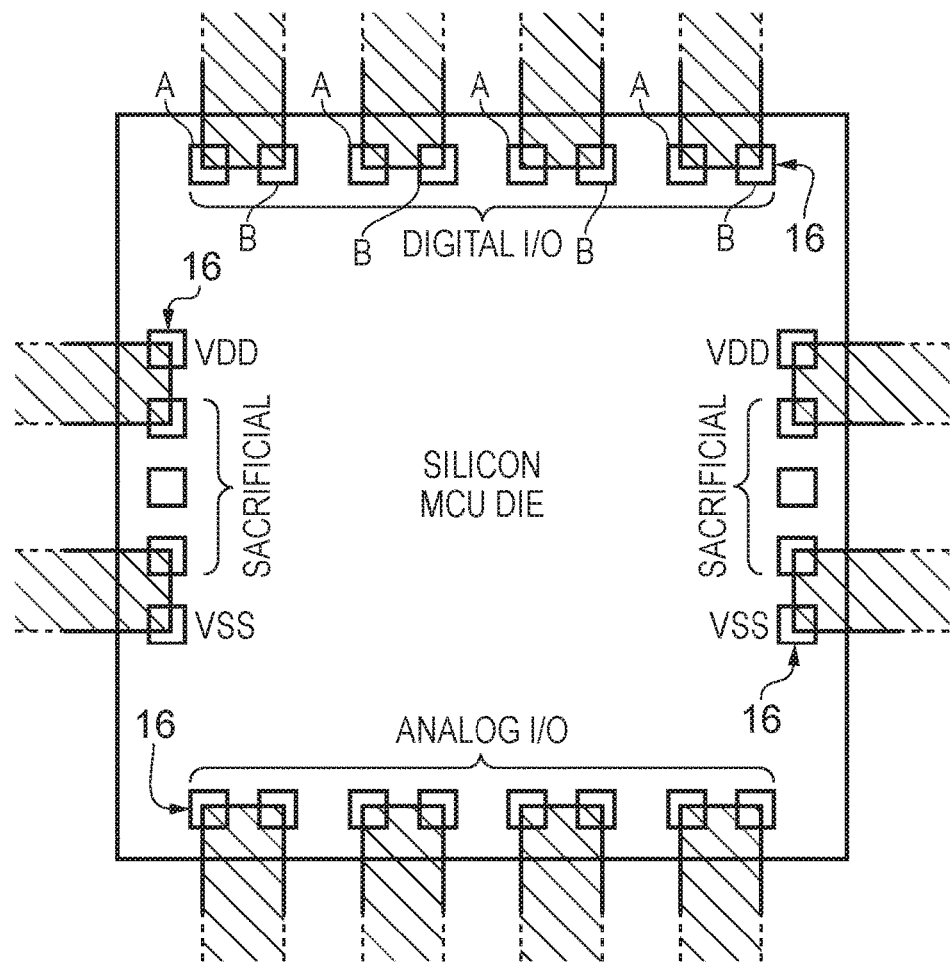
FIG. 1B shows in more detail a silicon-implemented microcontroller chip in one embodiment such as that shown in FIG. 1A and a number of printed connections from the printed circuitry which each cover two input-output pads of the silicon implemented micro-controller chip.

FIG. 1A shows a printed circuit 10 which comprises various printed circuit components 12 and onto which has been mounted a microcontroller unit (MCU) 14 embodied as a silicon chip. The MCU 14 is connected to the various printed circuit components 12 by connections which are also printed and therefore subject to the resolution available to the printing process. In this example embodiment these connections (printed traces) are provided with 160 µm pitch. Conversely, the MCU 14 has been manufactured using a technology which supports a finer resolution, wherein its input-output (IO) pads have a 80 µm pitch. Accordingly, each individual printed connection between a printed circuit component 12 of the printed circuit 10 contact two pads of the MCU 14 (although this cannot be seen in FIG. 1A due to the scale of the illustration). Refer to FIG. 1B for further detail. It should be noted that all other components and connections to the pads 16 have been omitted from FIG. 1B, purely to focus the discussion on the external connections to the pads 16.

FIG. 1B schematically illustrates in more detail the pads of the silicon-implemented MCU 14 of FIG. 1A and the connections coming from the printed circuit 10 which connect to these pads 16. As shown in FIG. 1B, these pads 16 may have a number of functions, for example providing digital input-output connections, analogue input-output connections, voltage supply connections (VDD, VSS) and so on. It should be noted that the present techniques are not limited to application with respect to pads having these particular functions. In this example embodiment the pads 16 have an 80 µm pitch, whereas the connections to the pads 16 coming from external to the silicon chip are printed traces with a 160 µm pitch. Accordingly, as can be clearly seen in FIG. 1B, each printed trace makes contact with two pads of the silicon chip. The silicon chip ("silicon MCU die") is however only provided in one physical configuration, where it is not predetermined whether it will be used in a context where individual connections to each pad 16 are possible or whether it will be used in a context in which (as in the case of FIG. 1B) connections to pairs of pads are possible.

As labelled in FIG. 1B, the pads on the periphery of the silicon MCU die have a number of different purposes. At the upper side the eight illustrated pads provide digital input-output (I/O) pads, whilst at the lower side the eight pads provide analogue input-output (I/O) pads. To the left and right can be seen voltage supply connections VDD and VSS. The digital I/O pads at the upper side are connected to the components of the silicon chip such that they may either be used as a single digital input-output interface or as two digital input-output interfaces, depending on the context in which the silicon chip is used. In particular, they are arranged such that either a single digital input-output interface is used in the case (such as that illustrated in FIG. 1B) where connections to these pads span two pads, whilst in situations in which the silicon chip is used in context where individual connections to the pads are made then two separate digital input-output interfaces can be supported. To support this feature, the input-output pads are subdivided into a first subset and second subset, these being labelled A and B in FIG. 1B, and these two subsets being interleaved with one another. This has the effect that when connections to these pads are made which span two pads (as illustrated) the individual pads of each subset are efficiently paired up in a manner in which the first pads of each subset are paired, the second pads of each subset are paired, and so on. This simplifies the connections and associated configurations of components connected to these pads.

To the lower side of the figure can be seen a set of analogue input-output pads. Further discussion of the driver circuitry connected to these pads is set out below with reference to FIG. 3B. To the left and right of the figure the voltage supply connections (VDD and VSS) can be seen to be made to pads which are adjacent to other pads which are labelled "sacrificial". This refers to the fact that these particular pads (being neighbouring pads to these voltage supply connections) have only potential (i.e. not guaranteed) functional usage, depending on the context in which the silicon chip is implemented (see the discussion of FIGS. 2A and 2B below). This allows the vital function of the voltage supply connections to be more reliably provided, regardless of whether individual connections are made to the individual pads of the silicon chip or joint (e.g. paired) connections as illustrated yet for these "sacrificial" pads to be made use of, when possible.

Figure 2A:
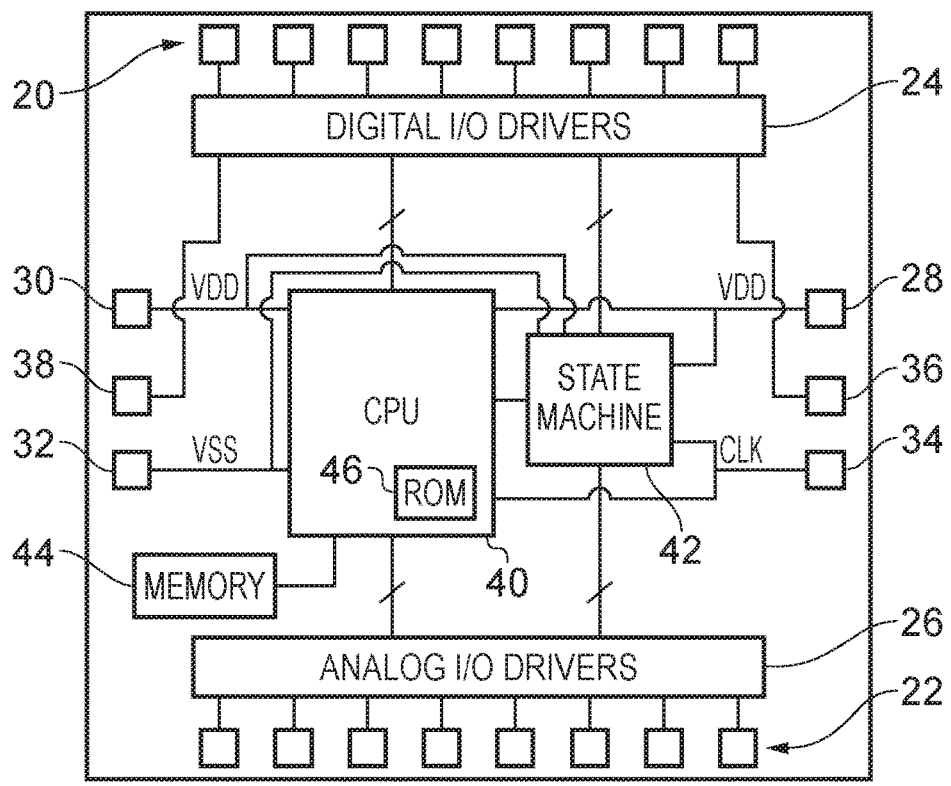
FIG. 2A illustrates further detail in one embodiment of the microcontroller chip shown in FIG. 1B, including a CPU, a memory and state machine.
Figure 2B:
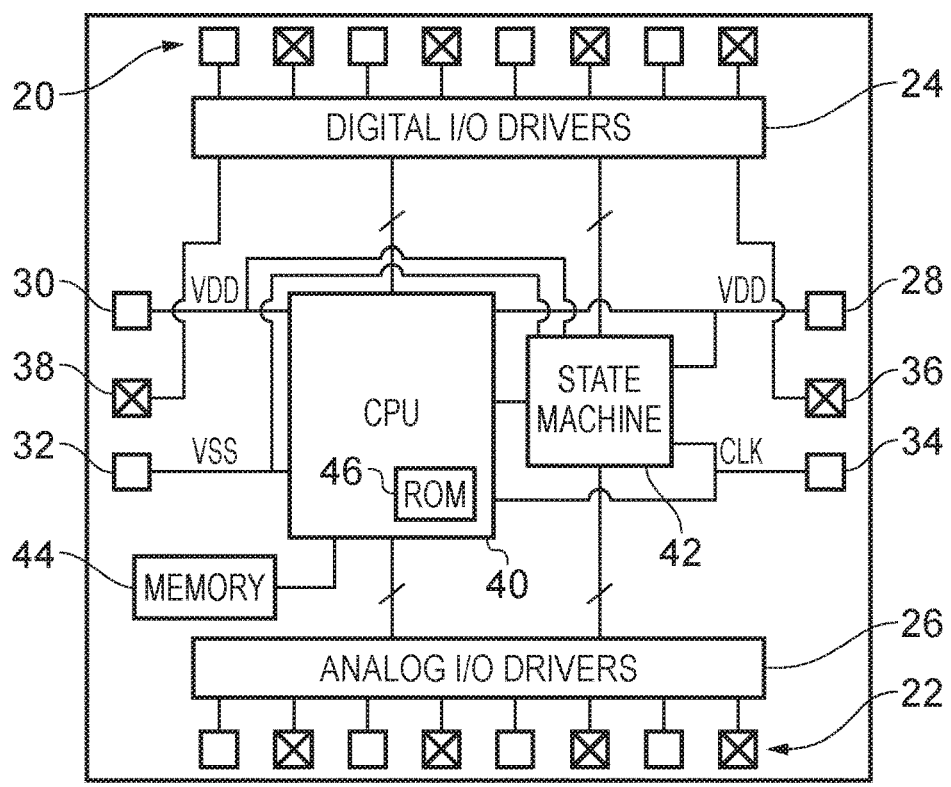
FIG. 2B illustrates the microcontroller chip of FIG. 2A, after self-test configuration for use with printed circuitry.

FIG. 2A schematically illustrates further detail of the internal configuration of an example silicon-implemented integrated circuit (chip). This is similar to that illustrated in the example embodiment of FIG. 1B, although note that the number of pads and their usages illustrated to the left and right of the figure differ slightly. In FIG. 2A, the input-output pads 20 used to provide one or more digital input-output interfaces 20 are each coupled to respective digital input-output drivers 24, which are discussed in more detail below with reference to FIG. 3A. Similarly, the set of input-output pads 22, which provide at least one analogue input-output interface, are also individually coupled to a set of analogue input-output drivers 26, which are discussed in more detail below with reference to FIG. 3B. Two pads 28 and 30 are used for VDD supply connections, whilst a single pad 32 is used for a VSS connection and a further single pad 34 is used for an external clock (CLK) connection. These voltage supply connections and external clock supply connection are internally connected to various components of the integrated circuit. In FIG. 2A, only connections to the CPU 40 and state machine 42 are explicitly shown, merely for clarity of illustration, but in practice it will be recognised that these connections will typically be made to virtually all (or indeed all) sub-components of the integrated circuit. Two further input-output pads 36 and 38 also potentially provide digital input-output connections and hence are also connected to the digital input-output drivers 24, i.e. there is a digital input-output driver provided for each of these digital input-output connections. The function of these particular digital input-output connections is however not critical to the operation of the integrated circuit. For example in the configuration shown in FIG. 2A they are each connected to LEDs (not shown) which provide the user with visual information about the operation of the integrated circuit, but their own operation does not functionally affect the integrated circuit. Whether these pads are active or not depends on the result of the self-test procedure, i.e. whether the electrical connection is found to be present between one of these pads and its neighbour. If the electrical connection is present, then the digital input-output driver for that pad (36 or 38) is disabled (see FIG. 3A for an example of how each digital input-output driver is enabled or disabled for both an input and an output configuration). FIG. 2B illustrates the same silicon-implemented integrated circuit (chip) as shown in FIG. 2A, but after implementation in the context of printed circuitry where connections to the pads (not shown in FIG. 2B) have been provided which span pairs of pads (as in the example of FIG. 1B). The Xs on some of the pads indicate those pads which, after the self-test procedure and subsequent configuration, are not individually used. As discussed above, in the case of pads 36 and 38 their drivers are simply disabled. As also discussed above, in the case of the sets of pads 20 and 22, this may be because these X-marked pads are paired up to be used in parallel with their paired pads, or may also be that they are simply disabled.

Overall control of the integrated circuit is administered by the CPU 40, which internally comprises a read only memory (ROM) 46. After a power-on-reset, a state machine 42 is configured to initialise components of the integrated circuit, including the CPU 40. The present techniques can make use of the state machine 42 in order to implement a self-test procedure for the integrated circuit, by means of which it can determine the nature of the external connections which have been made to its peripheral pads. The present techniques may alternatively make use of the CPU to administer this self-test procedure, for example with reference to instructions stored in the ROM 46, although generally this will require the state machine 42 to initialise the CPU 40 first, before the CPU is able to administer this self-test procedure. Accordingly, it may be preferred to configure the state machine 42 to carry out self-test procedure, such that this forms part of the first steps which the integrated circuit takes after power-on-reset. The integrated circuit also comprises a memory 44 coupled to the CPU 40, to which the CPU is able to store and from which the CPU is able to retrieve data items supporting its data processing activities. Accordingly, either the CPU 40 or the state machine 42 in the illustrated embodiment of FIG. 2 can be considered to be a control device for implementing a self-test procedure for the integrated circuit. More detail of the self-test procedure is given below with respect to the following figures.

Figure 2C:
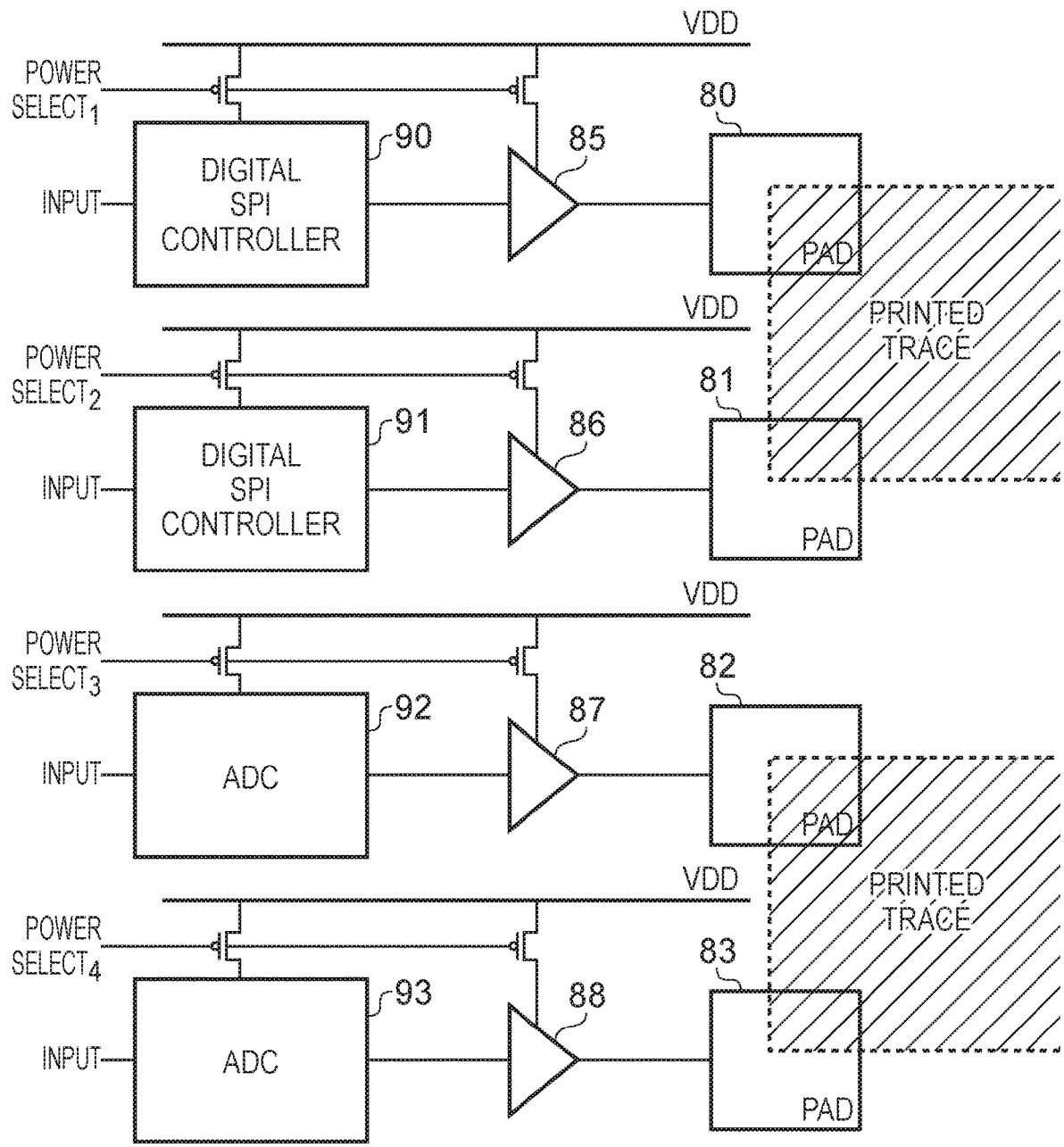
FIG. 2C schematically illustrates four input-output pads and their associated drivers and controllers in one embodiment in which power-gating is supported.

FIG. 2C schematically illustrates four input-output pads 80-83, with associated drivers 85-88 and controllers 90-93. As shown by the hatched areas in the figure, pads 80 and 81 are electrically connected (as in the case of FIG. 1B) by a printed trace which makes contact with both pads, and pads 82 and 83 are similarly connected. After the self-test procedure has been carried out (thus determining that these inter-pad connections are present), where only one driver/controller is used to drive/control a connected input-output pad pair (e.g. pads 80 and 81), the unused drivers and controllers are, in this embodiment, power-gated by means of the control device (e.g. the state machine or the CPU) appropriately asserting the power select signals (POWER SELECT$_{1-4}$). In the example of FIG. 2C, digital SPI (serial peripheral interface) controller 90 and driver 85 are active, whilst digital SPI controller 91 and driver 86 are power-gated off. Similarly, ADC (analogue-digital converter) 92 and driver 87 are active, whilst ADC 93 and driver 88 are power-gated off.

Figure 3A:
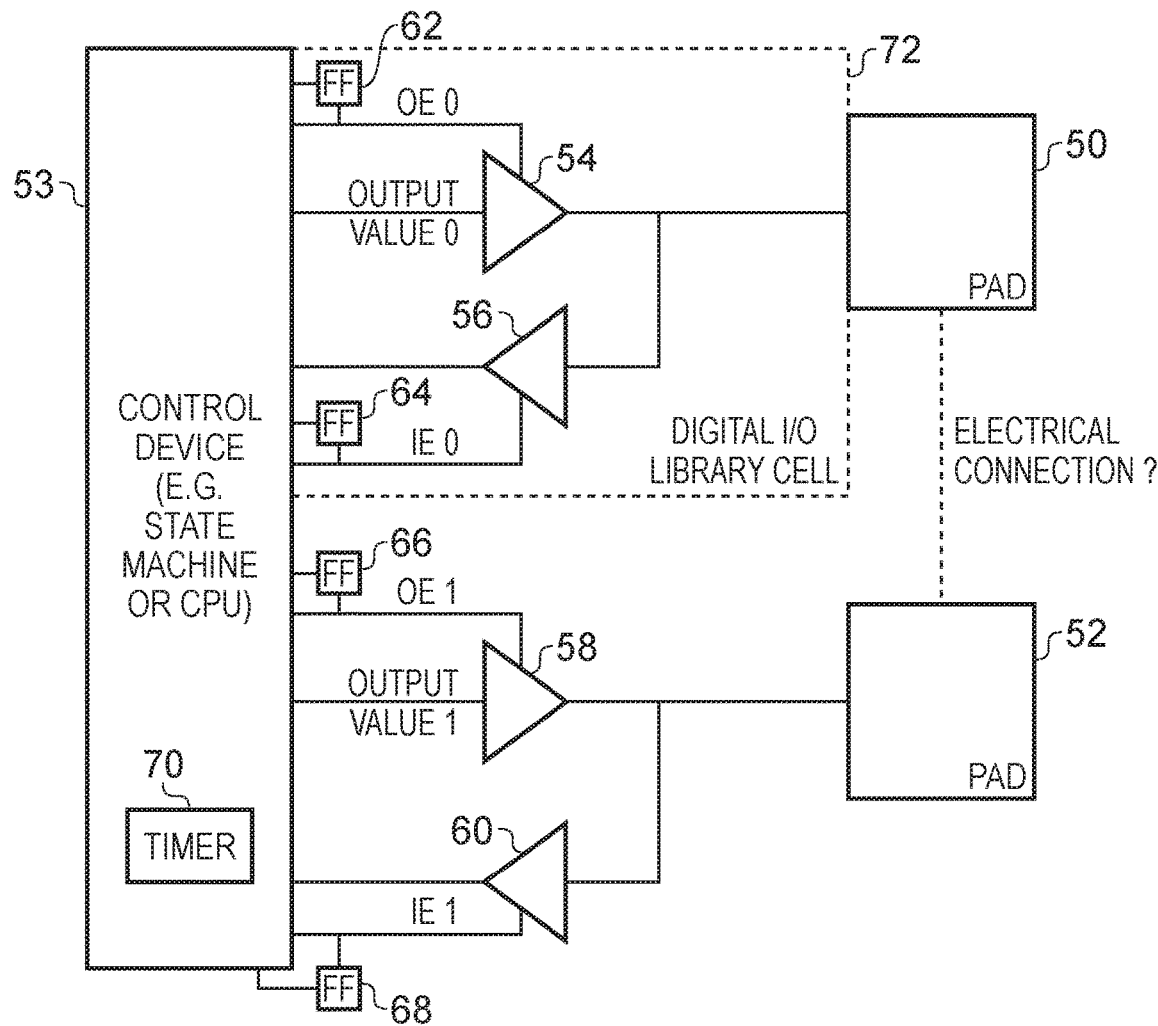
FIG. 3A schematically illustrates two input-output pads and their associated digital input-output drivers in one embodiment.

FIG. 3A schematically illustrates two pads 50 and 52 connected to driver circuitry for each pad consisting of an output driver (buffer) 54 and input driver (buffer) 56 for pad 50 and an output driver (buffer) 58 and an input driver (buffer) 60 for pad 52. Control over these input-output buffers 54, 56, 58, 60 is exerted by the respective enable signals OE0, IE0, OE1 and IE1, generated by the control device 53. This enables the integrated circuit to select whether each individual pad (in the example of FIG. 3A this being pads 50 and 52) are used at all, and when used whether this is in an output or in an input configuration. As part of the self-test procedure, the control device 53 of the integrated circuit (which as explained above could for example be a state machine or a CPU) is configured to determine if there is an electrical connection (i.e. a short) between the pad 50 and the pad 52. To do this, the control device configures one pad to be in an output functionality, i.e. its output buffer rather than its input buffer is enabled, and configures the other pad to be in an input configuration, i.e. its input buffer is active whilst its output buffer is inactive. The control device can then determine if an output value passed to the pad configured for output is then received by the pad configured for input. For example, according to the example shown in FIG. 3A, the control device can disable input buffer 56 and output buffer 58, whilst enabling output buffer 54 and input buffer 60, to then determine if the output value driven by the output buffer 54 ("output value 0") onto the pad 50 is then received by the input buffer 60. However, whilst only a single value output by one buffer and received by the other could be viewed as sufficient to determine if there is an electrical connection between pads 50 and 52, according to the present techniques a test sequence of electrical states (values) may be used to more reliably and exhaustively test if there is an electrical connection between the two pads, as will be described in more detail below with reference to FIG. 4A.

Once the control device has determined whether the electrical connection between pads 50 and 52 exists, it can then configure the input-output buffers for use during subsequent normal operation of the integrated circuit. For this purpose, flip-flops 62, 64, 66 and 68 are provided which hold a value for each of the buffers 54, 56, 58 and 60, to hold the respective buffer in a defined input or output configuration (or indeed permanently off). The control device can also make use of a timer 70 to determine a time characteristic of a received input value, in order to estimate the capacitance of the connection which has provided that value. More detail of this is discussed below with reference to FIG. 4B. Finally, note that in terms of designing the layout of the integrated circuit, a digital I-O library cell 72 may be provided which can be used by the system designer to implement a bidirectional input-output driver for each pad of the integrated circuit. This cell 72 may for example be provided as part of a library of cells to which the system designer has access when configuring the layout of the integrated circuit.

Figure 3B:
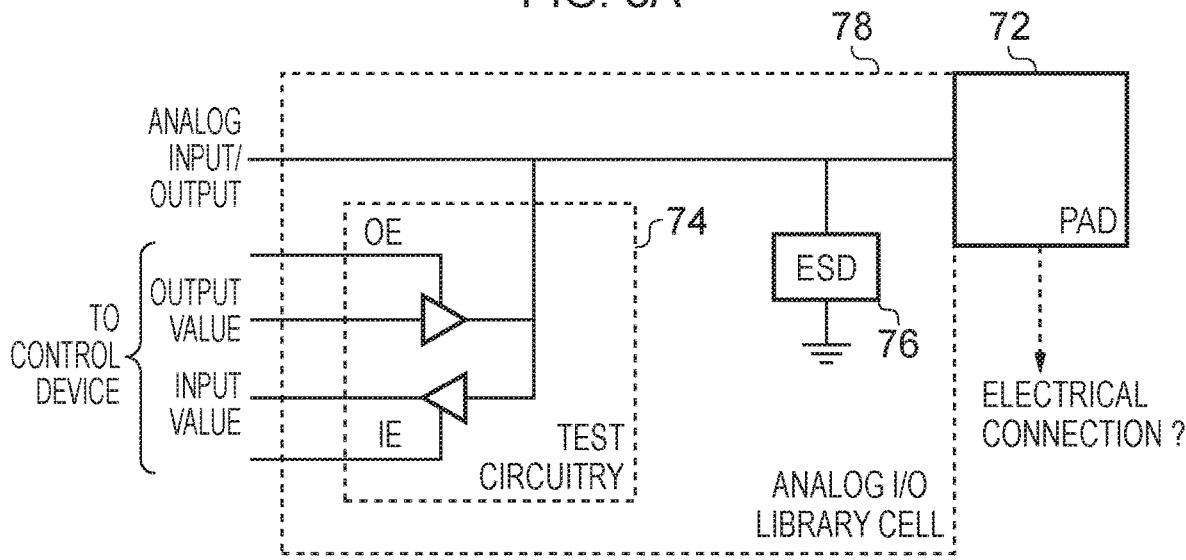
FIG. 3B schematically illustrates an input-output pad together with its analogue input-output driver in one embodiment.

FIG. 3B schematically illustrates digital driver circuitry which may be used in implementing the present techniques in association with an analogue input-output pad. Thus the pad 72 shown in FIG. 3B is to be used for an analogue connection and as part of the self-test procedure it is to be determined whether this pad has an electrical connection to an adjacent pad. For this purpose digital test circuitry 74 is provided which enables the control device to carry out a similar electrical connection testing procedure as was described with reference to FIG. 3A for a digital input-output pad, even though pad 72 shown in FIG. 3B is used for an analogue connection (which therefore would otherwise be unable to enable/disable its pad in the required manner). The digital test circuitry is only active during the test-procedure and is then disabled to allow normal analogue usage of the analogue input-output pad. An electrostatic device (ESD) 76 is also connected to the analogue pad 72 in order to provide electrostatic protection for components coupled to this pad. In terms of providing the layout of the integrated circuit, the analogue I/O library cell 78 may also be provided (for example as part of a library of cells) to enable a circuit designer to implement this above-described type of configurable and testable analogue input-output driver and pad.

Figure 4A:
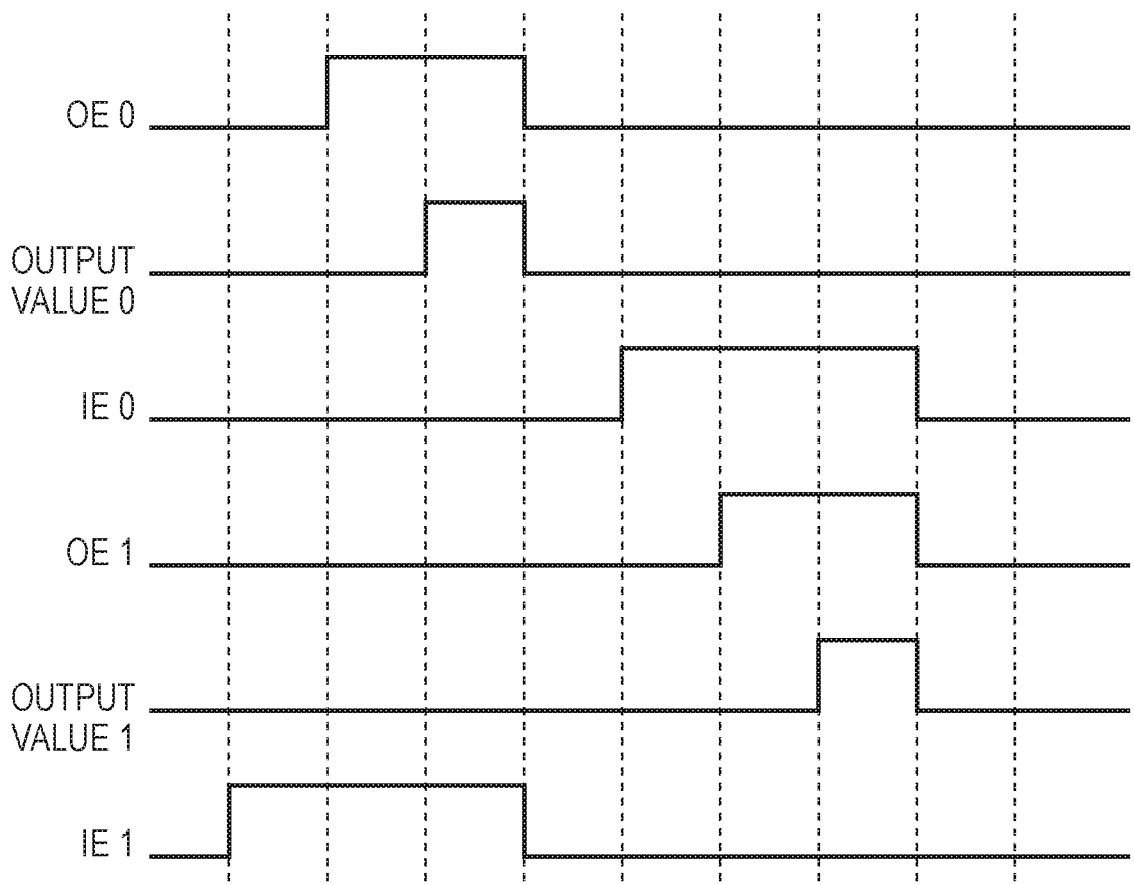
FIG. 4A shows an example signal test pattern used in one embodiment for testing a pair of input-output pads.

FIG. 4A illustrates an example sequence of control values and output values which are used by a control device in one embodiment (such as that shown in FIG. 3A) to carry out the self-test procedure to determine whether there is an electrical connection between two pads. As can be seen from FIG. 4A, this test sequence comprises an initial period when IE1 is active, i.e. input buffer 60 is active, followed by a second period when IE0 is active, i.e. input buffer 56 is active. In the initial period where input buffer 60 is active there are three stages: first where output buffer 54 is disabled and no value is set as output value 0; then a period when output buffer 54 is enabled (OE0=1), but still no value is output as output value 0; and finally a period when a value 1 is provided as the output value 0. This enables an exhaustive testing of the connection between the possible connection between pad 50 and 52 in the direction where pad 50 is in an output configuration and pad 52 is in an input configuration to be made. The second portion of the test sequence shown in FIG. 4A enables the reverse test, i.e. testing for the possible electrical connection when pad 52 is in an output configuration and pad 50 is in an input configuration. Overall, this exhaustive testing procedure enables it to be determined if the output value is truly being passed from one pad to the other, or whether one pad is perhaps (may be by a manufacturing flaw) permanently tied to a particular value, for example by a rogue connection to VDD or VSS.

Figure 4B:
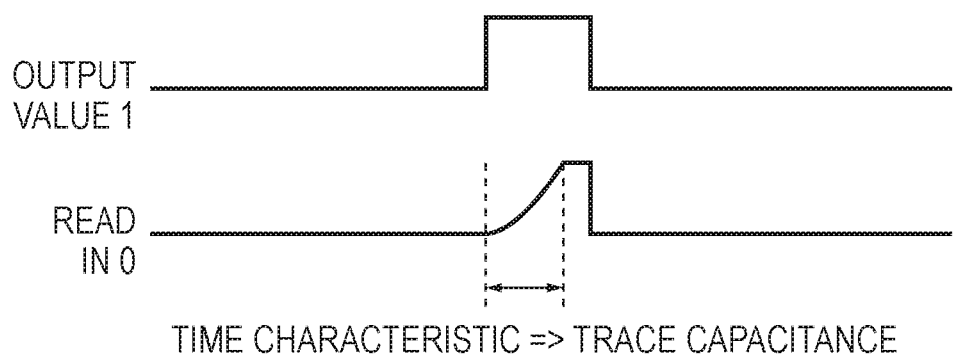
FIG. 4B schematically illustrates example signals used for capacitance determination when testing an input-output pad in one embodiment.

When testing for the possible electrical connection between two pads, as mentioned above with reference to the timer 70 shown in the control device of FIG. 3A, a time characteristic of the received value from an input buffer may be measured. FIG. 4B illustrates how an one output value ("output value 1") may be measured as a read input value ("read in 0"), wherein the time characteristic measured for the input value gives an indication of the capacitance of the trace (connection) to which the pad is connected. This information may be used in a variety of ways by the present techniques. For example, where a high trace capacitance is determined and where the electrical connection is found to be present between two adjacent pads, then the control device could configure those adjacent pads for parallel output driver configuration in order to provide a more powerful driver with respect to this high capacitance connection. However, the present techniques also recognise that a longer time characteristic of the input value could also result from a weak connection (perhaps due to a manufacturing flaw) between two pads. The control device can determine whether a longer time characteristic is due to the true high capacitance of a trace connection to one pad, or a poor connection resulting from a poor overlap between pads by simultaneously enabling the inputs of both input buffers 56 and 60 in the example of FIG. 3A, since if there is a good electrical connection between pads 50 and 52 then the input seen from buffers 56 and 60 will be the same, whereas if there is a poor electrical connection between pads 50 and 52 then the input seen from buffers 56 and 60 will differ.

Figure 5:
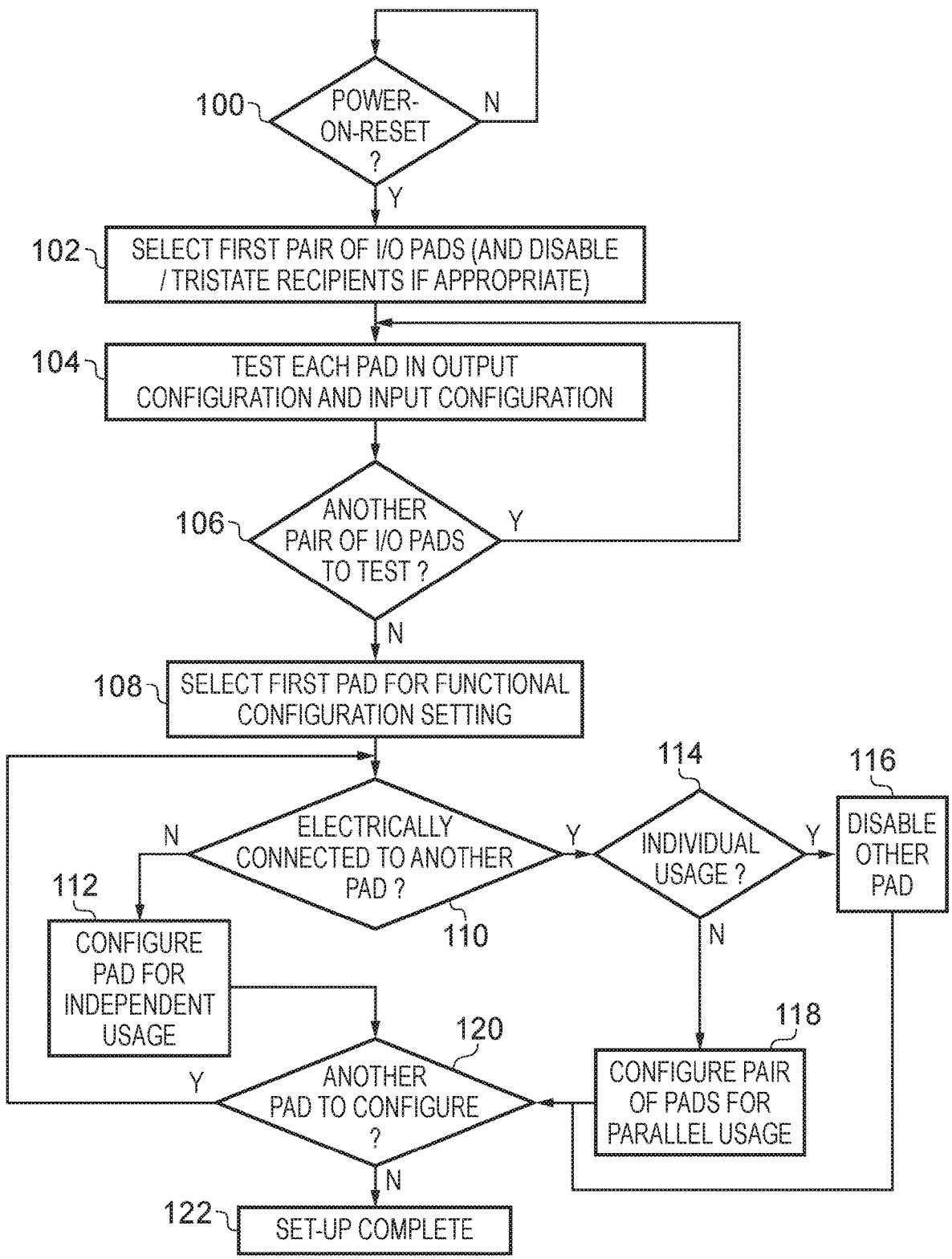
FIG. 5 shows an example sequence of steps by which the self-testing of the control device is carried out in one embodiment.

FIG. 5 illustrates a sequence of steps which are taken in one embodiment by a control device carrying out the self-test procedure. In this embodiment, the method is carried out immediately after power-on-reset and accordingly the flow waits at step 100 until power-on-reset occurs. When it does, the flow proceeds to step 102 where the first pair of input-output pads are selected for testing, and if necessary/appropriate components which are connected to these input-output pads beyond the integrated circuit (as for example will be described below with reference to FIGS. 6A and 6B) are disabled or tri-stated in order to protect them during testing. The flow then proceeds to step 104 where each pad of the pair selected are tested in an input configuration and in an output configuration. Once the testing has been performed, then at step 106 it is determined if there is another pair of input-output pads to test and whilst this is true the flow returns to step 104 for each pair of pads to be iteratively tested. Once all input-output pads have been tested, then the flow proceeds to step 108 where the first pad of the integrated circuit is selected for functional configuration setting. Then at step 110 if this pad has been determined not to be electrically connected to another pad, then the flow proceeds to step 112 where this pad is configured for independent usage, whereas if it has been determined that there is an electrical connection to another pad then the flow proceeds to step 114. At step 114 it is determined if this pad should be used individually or in parallel. If it should be used individually then the flow proceeds to step 116 where the other pad (to which it is connected) is disabled, whilst if it is to be used in parallel configuration then this is set up at step 118. At step 120 it is determined if there is another pad to be configured and if this is true the flow returns to step 110. Once all pads have been configured (on this integrated circuit) for subsequent functional usage then the set up is complete at step 122. If the integrated circuit is coupled to other integrated circuits, then iterative testing of the pads of those integrated circuits may then be carried out.

Figure 6A:
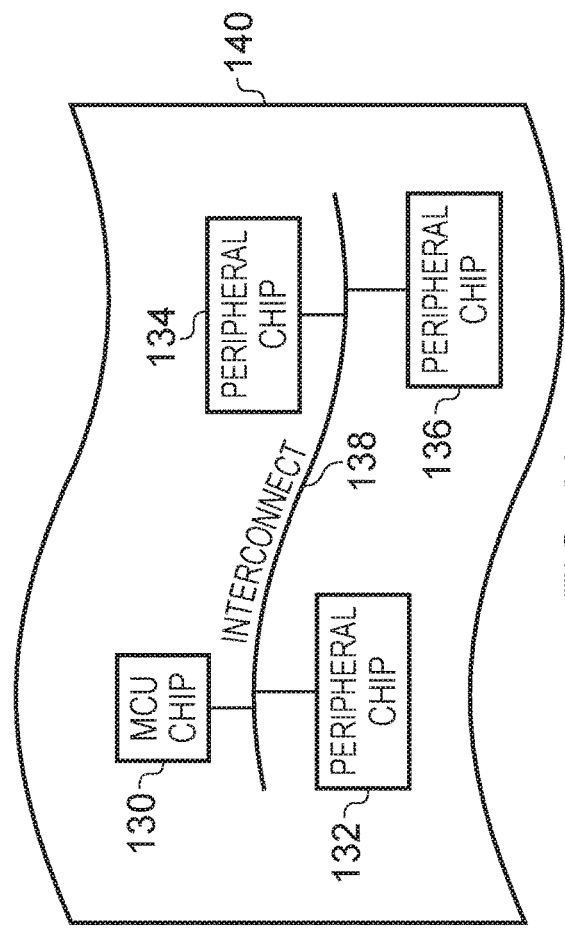
FIG. 6A shows printed circuitry in one embodiment in which a microcontroller chip and three peripheral chips are provided.

FIG. 6A schematically illustrates an example embodiment in which four integrated circuits 130, 132, 134 and 136 are implemented on a printed circuit 140. The four silicon chips are connected by an interconnect 138. In the example shown in FIG. 6A, silicon chip 130 is a microcontroller unit, whilst silicon chips 132, 134 and 136 provide peripherals, such as memory devices.

Figure 6B:
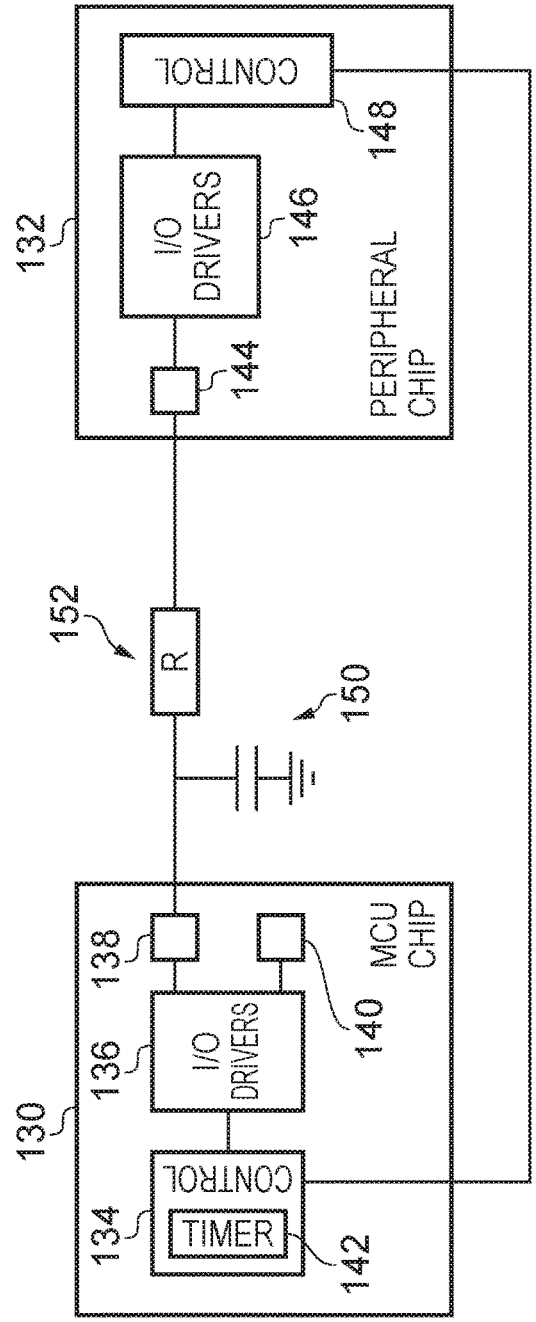
FIG. 6B schematically illustrates a microcontroller chip and a peripheral chip and some of their interconnections in one embodiment.

FIG. 6B schematically illustrates some further detail of two of the silicon chips shown in FIG. 6A, namely microcontroller chip 130 and peripheral chip 132. A control device 134 of microcontroller chip 130 configures the input-output drivers 136, which are coupled to the two illustrated input-output pads 138 and 140. Pad 138 can be seen from FIG. 6B to be coupled to the pad 144 of peripheral chip 132, which itself is coupled to the input-output drivers 146 which are controlled by the control unit 148 of peripheral chip 132. Note in particular that control unit 134 of microcontroller chip 130 and control unit 148 of peripheral chip 132 are communicatively connected together, such that one can signal to the other. Whilst this could be provided as a dedicated communication path as in the schematic illustration of FIG. 6B, this communicative path may be provided by the interconnect 138 shown in FIG. 6A. This communicative path enables controller unit 134 to signal to control unit 148 when it is performing the self-test procedure, and whilst this testing is going on the control unit 148 is configured to disable or tri-state the input-output drivers 136 connected with the pad 144 such that the self-testing procedure being carried out by microcontroller chip 130 cannot damage components of the peripheral chip 132. Indeed, in the example embodiment shown in FIG. 6A, the four chips are communicatively connected together such that only one of the chips can carry out its self-test procedure at any one given time, and during which period the other three chips are configured not only not to carry out their own testing but also to hold their input-output drivers in a disabled or tri-stated configuration, such that their components cannot be damaged by the self-test of the other chip. FIG. 6B also schematically illustrates the capacitance 150 of the path between pad 138 and pad 144, which may be determined by a timing measurement as described above. A resistor 152 is also shown in FIG. 6B, which may simply be the inherent resistance of the path, or may be an explicit resistor placed by the system designer in order to provide a further level of protection for components of one integrated circuit whilst the other is being tested.

In overall summary the present techniques provide for the implementation of a self-test procedure of an integrated circuit, where the self-test procedure comprises testing for an electrical connection between first and second input-output pads of the integrated circuit. A control device is capable of adapting a functional configuration of usage of the first and second input-output pads in dependence on presence of the electrical connection. A corresponding integrated circuit, printed circuit and method are also provided. These techniques allow the integrated circuit to be used in a variety of contexts, without requiring physical customisation of the integrated circuit to adapt it to its usage context, in particular where connections from the context to the pads of the integrated circuit may be made to individual pads in some contexts or may span more than one pad in other contexts.

Although illustrative embodiments have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. A control device for on-chip implementation, comprising:
control circuitry to implement a self-test procedure, wherein the self-test procedure comprises testing for electrical connection, external to the on-chip implementation, between first and second input-output pads to which the control device is connected, and
configuration circuitry to adapt a functional configuration of usage of the first and second input-output pads in dependence on presence of the electrical connection.

2. The control device as claimed in claim 1, wherein the control device is connected to a plurality of input-output pads comprising the first and second input-output pads, and the self-test procedure comprises iteratively testing each input-output pad of the plurality of input-output pads for electrical connection between that input-output pad and an adjacent input-output pad.

3. The control device as claimed in claim 1, wherein the control device is capable of disabling usage of one of the first and second input-output pads in response to the presence of the electrical connection between the first and second input-output pads.

4. The control device as claimed in claim 1, wherein the control device is capable of configuring parallel output usage of the first and second input-output pads in response to the presence of the electrical connection between the first and second input-output pads.

5. The control device as claimed in claim 1, wherein testing for electrical connection between the first and second input-output pads further comprises a capacitance determination with respect to the first and second input-output pads, and the control device is capable of selecting between more than one usage configuration of the first and second input-output pads in dependence on the capacitance determination.

6. The control device as claimed in claim 1, wherein the first and second input-output pads are bidirectional input-output pads, and the self-test procedure comprises testing each of the first and second input-output pads in an input pad configuration and in an output pad configuration.

7. The control device as claimed in claim 1, wherein testing for electrical connection between the first and second input-output pads comprises applying a test sequence of electrical states to one of the first and second input-output pads in an output pad configuration and measuring a resulting sequence of electrical states of the other of the first and second input-output pads in an input pad configuration.

8. The control device as claimed in claim 1, wherein the control device is capable of causing a result of the self-test procedure to be stored and to cause further usage of the first and second input-output pads to depend on the stored result of the self-test procedure.

9. The control device as claimed in claim 1, wherein the control device is one of: a state machine, a CPU; and a peripheral device.

10. An integrated circuit comprising:
the control device as claimed in claim 1.

11. The integrated circuit as claimed in claim 10, comprising a plurality of input-output pads,
wherein the plurality of input-output pads comprises a protected input-output pad which has a dedicated input function for the integrated circuit, and wherein a neighbouring input-output pad to the protected input-output pad has a configuration for disabling the neighbouring input-output pad when the electrical connection is present.

12. The integrated circuit as claimed in claim 11, wherein the protected input-output pad provides a voltage supply connection.

13. The integrated circuit as claimed in claim 11, wherein the protected input-output pad provides a clock signal connection.

14. The integrated circuit as claimed in claim 10, comprising a plurality of input-output pads, wherein a first subset of the plurality of input-output pads provides a first input-output interface and a second subset of the plurality of input-output pads provides a second input-output interface, and the first subset is interleaved with the second subset.

15. The integrated circuit as claimed in claim 10, comprising an analogue input-output pad and digital test circuitry connected to the analogue input-output pad, wherein the digital test circuitry is capable of selecting between an input configuration and an output configuration for the analogue input-output pad during the self-test procedure, and wherein the digital test circuitry is disabled during subsequent operation of the integrated circuit.

16. The integrated circuit as claimed in claim 10, comprising power-gating circuitry for providing a selectable power supply to an input-output pad control component, wherein the control device is capable of controlling the power gating circuitry to disconnect the selectable power supply from input-output pad control component.

17. Circuitry comprising printed circuit components connected to the integrated circuit as claimed in claim 10.

18. The circuitry as claimed in claim 17 comprising a printed conductive component electrically connecting the first and second input-output pads.

19. The circuitry as claimed in claim 17, comprising a plurality of control devices, each of the control devices being capable of implementing a self-test procedure, wherein the self-test procedure comprises testing for electrical connection between first and second input-output pads to which the control device is connected, and adapting a functional configuration of usage of the first and second input-output pads in dependence on presence of the electrical connection, wherein the plurality of control devices are communicatively interconnected to implement a testing protocol in which only one control device of the plurality of control devices at a time carries out its self-test procedure whilst input-output pads of the other control devices are held in a non-operational state.

20. A method of self-testing in a control device comprising:
testing for electrical connection, external to an on-chip implementation of the control device, between first and second input-output pads to which the control device is connected;
and adapting a functional configuration of usage of the first and second input-output pads in dependence on presence of the electrical connection.

21. A control device comprising:
means for testing for electrical connection, external to an on-chip implementation of the control device, between first and second input-output pads to which the control device is connected; and
means for adapting a functional configuration of usage of the first and second input-output pads in dependence on presence of the electrical connection.

* * * * *